United States Patent
Kwon et al.

(10) Patent No.: US 6,395,411 B1
(45) Date of Patent: May 28, 2002

(54) DISPLAY DEVICE ADOPTING LIGHT-EMITTING COMPOUND AS COLOR-DEVELOPING SUBSTANCE

(75) Inventors: Soon-ki Kwon, Chinju; Yun-hi Kim, Pusan; Dong-cheol Shin, Chinju; Han-sung Yu, Anyang; Sung-woo Cho, Sungnam; Dong-hyun Kim, Suwon; Sung-hyun Cho, Seoul, all of (KR)

(73) Assignee: Samsung Display Devices Co., Ltd., Suwon (KR)

( * ) Notice: Subject to any disclaimer, the term of this patent is extended or adjusted under 35 U.S.C. 154(b) by 0 days.

(21) Appl. No.: 09/351,162

(22) Filed: Jul. 12, 1999

(30) Foreign Application Priority Data

Nov. 12, 1998 (KR) ............................... 98-48405

(51) Int. Cl.[7] ............................... H05B 33/14
(52) U.S. Cl. .................. 428/690; 428/917; 428/704; 313/504; 313/506; 257/40; 257/103; 252/301.35; 252/301.16
(58) Field of Search ................ 428/690, 917, 428/704; 313/504, 506; 257/40, 103; 252/301.35, 301.16

(56) References Cited

U.S. PATENT DOCUMENTS 5,536,939 A * 7/1996 Hosokawa et al. .......... 257/40

OTHER PUBLICATIONS

"Development and Application of Electroluminescent Device", The Collection of Papers of the Macromolecular Chemical Symposium, vol. 11(3), 1998.

Ahn et al.; "EL polymer containing silicon 1,3,4–oxadiazole in main chain, and optical characteristics thereof", Abstracts, vol. 23, No. 2, Oct. 1998.

* cited by examiner

Primary Examiner—Cynthia H. Kelly
Assistant Examiner—Ling Xu
(74) Attorney, Agent, or Firm—Leydig, Voit & Mayer, Ltd.

(57) ABSTRACT

A light-emitting compound and a display device adopting the light-emitting compound as a color-developing substance. When an organic layer such as a light-emitting layer is formed using the light-emitting compound as a blue light-emitting material, an organic electro-luminescence device having improved luminous efficiency and luminance characteristics can be obtained.

4 Claims, 3 Drawing Sheets

DISPLAY DEVICE ADOPTING LIGHT-EMITTING COMPOUND AS COLOR-DEVELOPING SUBSTANCE

BACKGROUND OF THE INVENTION

1. Field of the Invention

The present invention relates to a blue light-emitting compound and a display device adopting the light-emitting compound as a color-developing substance.

2. Description of the Related Art

Recent advances in the information and communications industries have increased the need for high performance display devices. Generally, display devices are classified into luminous types and non-luminous types. Luminous type display devices include cathode ray tube (CRT) and light emitting diode (LED), and non-luminous type display device include liquid crystal display (LCD).

As an index of the basic performance of the display device, there are operating voltage, power consumption, luminance, contrast, response time, life span and display color, among others.

The LCD, as one of the non-luminous type display devices, has been most favored recently, due to its light weight and low power consumption. However, characteristics such as response time, contrast and viewing angle properties are unsatisfactory, leaving room for improvement. Meanwhile, an electro-luminescence (EL) device has been focused as a next generation display device which can solve such problems.

The EL device as a spontaneous luminous type display has a broad viewing angle, a good contrast characteristic and a rapid response time. The EL device is classified into an inorganic EL device and an organic EL device depending on the material used for a light-emitting layer. In particular, the organic EL device has good luminance, driving voltage and response time characteristic and can display a multitude of colors, compared to the inorganic EL device.

Figure 1:
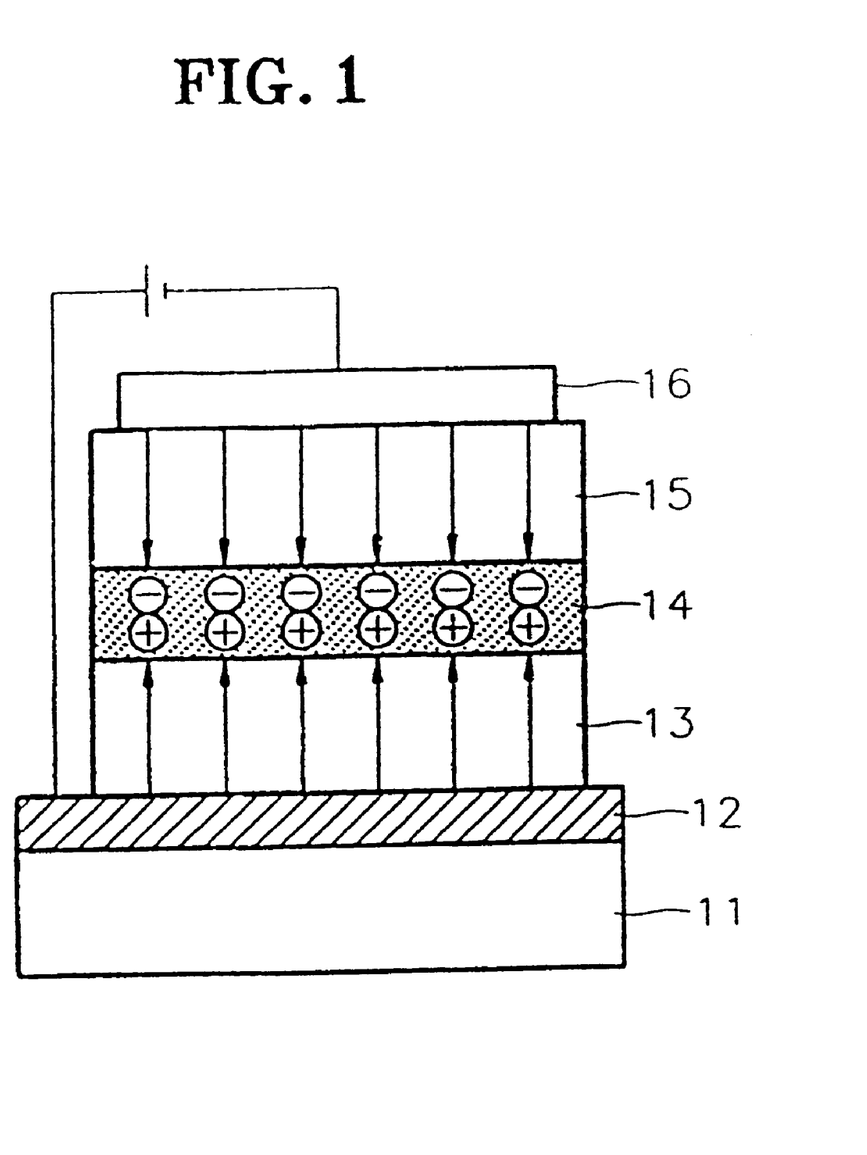
FIG. 1 is a section view showing the structure of a general organic electro-luminescence (EL) device.

FIG. 1 is a section view showing the structure of a general EL device. Referring to FIG. 1, an anode 12 is formed on a substrate 11. A hole transport layer 13, a light-emitting layer 14, an electron transport layer 15, and a cathode 16 are formed on the anode 12 in sequence. Here, the hole transport layer 13, the light-emitting layer 14 and the electron transport layer 15 are organic thin films formed of an organic compound.

The organic EL device having the above structure operates based on the following operation principle. When a voltage is applied between the anode 12 and the cathode 16, holes injected from the anode 12 move through the hole transport layer 13 to the light-emitting layer 14. Meanwhile, electrons are injected from the cathode 16 through the electron transport layer 15 to the light-emitting layer 14. Also, carriers are recoupled in the light-emitting layer 14 to generate excitons. The exitons are transited from an excited state to a ground state, so that fluorescent molecules of the light-emitting layer emit light to form a picture.

Also, an organic EL device adopting an aromatic diamine and aluminum complex having a low molecular weight has been developed by Eastman Kodak Company (*Appl. Phys. Lett.* 51, 913, 1987)

In addition, an organic EL device adopting a polymer such as poly(p-phenylenevinylene) (PPV) or poly(2-methoxy-5-(2'-ethylhexyloxy)-1,4-phenylenevinylene) as a material for a light-emitting layer has been disclosed (*Nature,* 347, 539, 1990, and *Appli. Phys. Lett.* 58, 1982, 1991). However, PPV among the polymers has a poor solubility in an organic solvent, so that it is difficult to adopt a spin-coating so as to form a film by spin-coating method. To solve this problem, a soluble PPV having a functional group capable of improving its solubility in an organic solvent has been developed. The organic EL device having a light-emitting layer formed of PPV or a derivative of the PPV displays a multitude of colors from green to orange.

Also, the well-known blue light-emitting compound is low in luminous efficiency compared to another color of light-emitting compound, thus a need for a new blue light-emitting compound having a high luminous efficiency has increased.

SUMMARY OF THE INVENTION

To solve the above problems, it is an object of the present invention to provide a blue light-emitting compound having excellent luminous efficiency and luminance characteristics.

It is another object of the present invention to provide a display device adopting the blue light-emitting compound as a color-developing substance.

To achieve the first object of the present invention, there is provided a a light-emitting compound represented by the chemical formula (1):

(1)

wherein $Ar_1$, $Ar_2$, $Ar_3$, $Ar_4$ and $Ar_5$ are independently selected from the group consisting of chemical bond, unsubstituted or substituted phenyl, unsubstituted or substituted naphthalene, unsubstituted or substituted anthracene, unsubstituted or substituted diphenylanthracene, unsubstituted or substituted phenanthrene, unsubstituted or substituted indene, unsubstituted or substituted acenaphthene, unsubstituted or substituted biphenyl, unsubstituted or substituted fluorene, unsubstituted or substituted carbazole, unsubstituted or substituted thiophene, unsubstituted or substituted pyridine, unsubstituted or substituted oxadiazole, unsubstituted or substituted oxazole, unsubstituted or substituted triazole, unsubstituted or substituted benzothiophene, unsubstituted or substituted dibenzofuran, and unsubstituted or substituted thiadiazole, and $R_1$, $R_2$, $R_3$ and $R_4$ are independently selected from the group consisting of hydrogen, ethyleneoxy group, $C_1$–$C_{20}$ alkyl group, aryl group, trimethylsilyl group, trimethylsilylaryl group and cyano group.

The second object of the present invention is achieved by a display adopting the light-emitting compound as a color-developing substance. Preferably, the display device is an organic electro-luminescence (EL) device adopting the light-emitting compound as a color-developing substance.

To achieve the second object of the present invention, there is provided an organic electro-luminescence device comprising an organic layer between a pair of electrodes, wherein the organic layer comprises a compound represented by the chemical formula (1):

(1)

wherein $Ar_1$, $Ar_2$, $Ar_3$, $Ar_4$ and $Ar_5$ are independently selected from the group consisting of chemical bond, unsubstituted or substituted phenyl, unsubstituted or substituted naphthalene, unsubstituted or substituted anthracene, unsubstituted or substituted diphenylanthracene, unsubstituted or substituted phenanthrene, unsubstituted or substituted indene, unsubstituted or substituted acenaphthene, unsubstituted or substituted biphenyl, unsubstituted or substituted fluorene, unsubstituted or substituted carbazole, unsubstituted or substituted thiophene, unsubstituted or substituted pyridine, unsubstituted or substituted oxadiazole, unsubstituted or substituted oxazole, unsubstituted or substituted triazole, unsubstituted or substituted benzothiophene, unsubstituted or substituted dibenzofuran, and unsubstituted or substituted thiadiazole, and $R_1$, $R_2$, $R_3$ and $R_4$ are independently selected from the group consisting of hydrogen, ethyleneoxy group, $C_1$–$C_{20}$ alkyl group, aryl group, trimethylsilyl group, trimethylsilylaryl group and cyano group.

Preferably, $Ar_3$ is represented by the following structural formula:

wherein $R_9$ and $R_{10}$ are independently a $C_1$–$C_{20}$ alkyl group or a $C_1$–$C_{20}$ alkoxy group.

Also, $Ar_2$ And $Ar_4$ are represented by the following structural formula:

wherein $R_{11}$, and $R_{12}$ are independently a $C_1$–$C_{20}$ alkyl group, phenyl group or alkylsilyl group.

BRIEF DESCRIPTION OF THE DRAWINGS

The above objects and advantages of the present invention will become more apparent by describing in detail preferred embodiments thereof with reference to the attached drawings in which:

FIGS. 2 and 3 illustrate the process of synthesizing the compounds represented by chemical formulae (2) and (3), respectively.

DESCRIPTION OF THE PREFERRED EMBODIMENTS

A light-emitting compound according to the present invention, represented by the following chemical formula (1), is a blue luminous material which is useful as a color-developing substance for a display device, particularly, an organic electro-luminescence (EL) material.

(1)

In the chemical formula (1), $Ar_1$, $Ar_2$, $Ar_3$, $Ar_4$ and $Ar_5$ are independently selected from the group consisting of chemical bond, unsubstituted or substituted phenyl, unsubstituted or substituted naphthalene, unsubstituted or substituted anthracene, unsubstituted or substituted diphenylanthracene, unsubstituted or substituted phenanthrene, unsubstituted or substituted indene, unsubstituted or substituted acenaphthene, unsubstituted or substituted biphenyl, unsubstituted or substituted fluorene, unsubstituted or substituted carbazole, unsubstituted or substituted thiophene, unsubstituted or substituted pyridine, unsubstituted or substituted oxadiazole, unsubstituted or substituted oxazole, unsubstituted or substituted triazole, unsubstituted or substituted benzothiophene, unsubstituted or substituted dibenzofuran, and unsubstituted or substituted thiadiazole, and $R_1$, $R_2$, $R_3$ and $R_4$ are independently selected from the group consisting of hydrogen, ethyleneoxy group, $C_1$–$C_{20}$ alkyl group, aryl group, trimethylsilyl group, trimethylsilylaryl group and cyano group.

Preferably, $Ar_3$ is represented bv the following structural formula.

In the above structural formula, $R_9$ and $R_{10}$ are independently a $C_1$ to $C_{20}$ alkyl group or a $C_1$ to $C_{20}$ alkoxy group.

In the chemical formula (1), the example of the substituted phenyl includes methoxyphenyl, methylphenyl, triphenylsilylphenyl and ethylhexyloxyphenyl, the example of the substituted naphthalene includes methoxynaphthalene and phenylnaphthalene, the example of the substituted anthracene includes phenylanthracene, the example of the substituted diphenylanthracene includes 2-phenoxy-9,10-diphenylanthracene, the example of the substituted phenanthrene includes phenylphenanthrene, the example of the substituted indene includes dihexylindene, the example of the substituted acenaphthene includes phenylacenaphthene, the example of the substituted biphenyl includes methoxybiphenyl and phenoxybiphenyl, the example of the substituted fluorene includes dimethylfluorene, diethylfluorene, dipropylfluorene, dibutylfluorene, dipentylfluorene, dihexylfluorene, diheptylfluorene, dioctylfluorene, dinonylfluorene, didecylfluorene, didodecylfluorene and diphenyl fluorene, the example of the substituted carbazole includes N-ethylhexylcarbazole, the example of the substituted thiophene includes 5-phenylthiophene, the example of the substituted pyridine includes phenylpyridine, the example of the substituted oxadiazole includes phenyloxadiazole and diphenyloxadiazole, the example of the substituted oxazole includes benzooxazole, the example of the substituted triazole includes 2,5-dipheyl-1-(3'-trifluoromethylphenyl)triazole, the example of the substituted benzothiophene includes phenylbenzothiophene, the example of the substituted dibenzofuran includes phenyldibenzofuran, and the example of the substituted thiadiazole includes phenylthiadiazole and diphenylthiadiazole.

For example, the compound represented by the chemical formula (1) according to the present invention may be compounds represented by chemical formulae (2) and (5).

(2)

(3)

(4)

(5)

The compound represented by the formula (2) is the compound when $Ar_1$, $Ar_2$, $Ar_4$ and $Ar_5$ are all phenyl groups, $Ar_3$ is represented by the following structural formula:

and $R_1$, $R_2$, $R_3$ and $R_4$ are all hydrogen in the chemical formula (1).

The compound represented by the formula (3) is the compound when $Ar_1$ and $Ar_5$ are all phenyl groups, $Ar_3$ is represented by the following structural formula:

$Ar_2$ and $Ar_4$ are single bonds, $R_2$ and $R_3$ are all hydrogen, and $R_1$ and $R_4$ are all cyano groups in the chemical formula (1).

The compound represented by the formula (4) is the compound when $Ar_1$, $Ar_3$ and $Ar_5$ are all phenyl groups, $Ar_2$ and $Ar_4$ are represented by the following structural formula:

$R_1$, $R_2$, $R_3$ and $R_4$ are all hydrogen in the chemical formula (1).

The compound represented by the formula (5) is the compound when $Ar_1$ and $Ar_5$ are all phenyl groups, $Ar_3$ is a single bond, $Ar_2$ and $Ar_4$ are represented by the following structural formula:

$R_1$, $R_2$, $R_3$ and $R_4$ are all hydrogen in the chemical formula (1).

In particular, the compounds of chemical formula (4) and (5) have dihexylfluorene group as $Ar_2$ and $Ar_4$, the dihexylfluorene group hinders π-stacking between the compound and adjacent compound. If such π-stacking is hindered, excitons can not be interacted each other. As a result, deterioration of luminous efficiency due to the interaction of excitons is prevented.

Hereinafter, a method for manufacturing an organic EL device according to the present invention will be described.

First, a material for an anode is coated on a substrate. Here, the substrate is a substrate used for a general organic EL device, preferably, a glass substrate or a transparent plastic substrate which is good in transparency, surface flatness, convenience in handling and waterproofing characteristic. Also, indium tin oxide (ITO), tin oxide ($SnO_2$) or zinc oxide (ZnO), which is good transparency and conductivity, is used as a material for the anode.

A material for forming a hole transport layer is deposited under vacuum or spin-coated on the anode electrode, to form a hole transport layer. The compound of the formula (1) is deposited under vacuum on the hole transport layer to form a light-emitting layer.

A metal for forming a cathode is deposited under vacuum on the light-emitting layer, to form a cathode, thereby completing an organic EL device. Here, the material for a cathode may be lithium (Li), magnesium (Mg), aluminum (Al), an Al—Li alloy, calcium (Ca), a magnesium-indium (Mg—In) alloy or a magnesium-silver (Mg—Ag) alloy.

Here, an electron transport layer may be formed before the cathode is formed on the light-emitting layer. The electron transport layer is formed of a general material for an electron transport layer.

The material for the hole transport layer is not limited to a specific material. Preferably, the material for the hole transport layer is N,N'-bis(3-methylphenyl)-N,N'-diphenyl-[1,1'-biphenyl]4,4'-diamine (TPD) or N,N'-di(naphthalene-1-yl)-N-N'-diphenyl-benzidine (α-NPD).

The organic EL device according to the present invention may further comprise an intermediate layer for improving characteristics of the device, between two layers selected from the anode, the hole transport layer, the light-emitting layer, the electron transport layer and the cathode. For example, a buffer layer may be formed between the anode and the hole transport layer. Such buffer layer decreases contact resistance between the anode and the hole transport layer, and simultaneously improves the transport ability of holes from the anode to the light-emitting layer, thereby improving overall characteristics of the device.

A material for the buffer layer is not limited to a specific material. However, preferably, the material for the buffer layer is polyethylene dioxythiophene (PEDT) or polyaniline.

The organic EL device is formed by stacking in sequence the anode, the hole transport layer, the light-emitting layer, the electron transport layer and the cathode as above. Alternatively, the order of stacking the respective layers may be reversed such that the cathode, the electron transport layer, the light-emitting layer, the hole transport layer and the anode are stacked in sequence.

Figure 2:
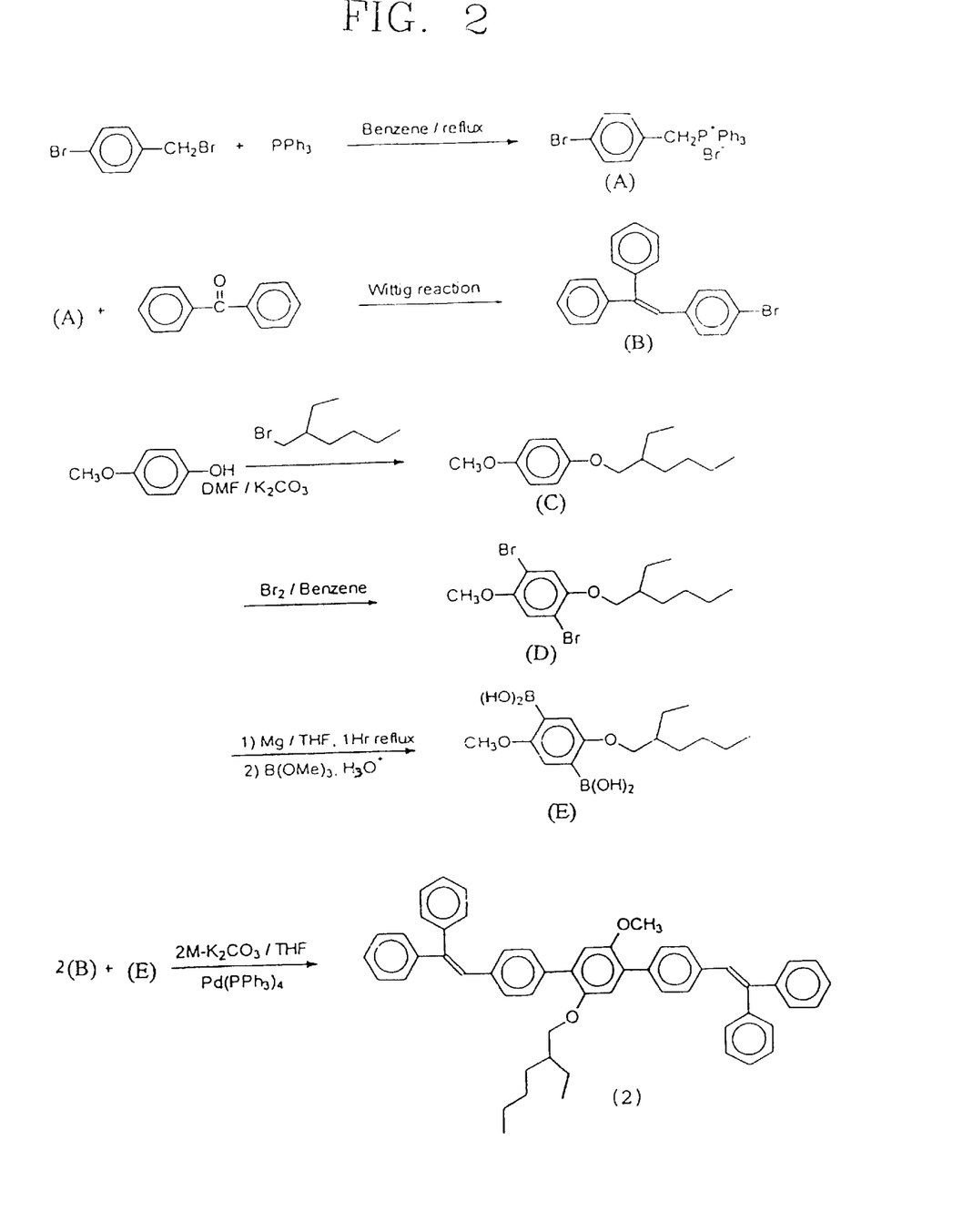
Figure 3:
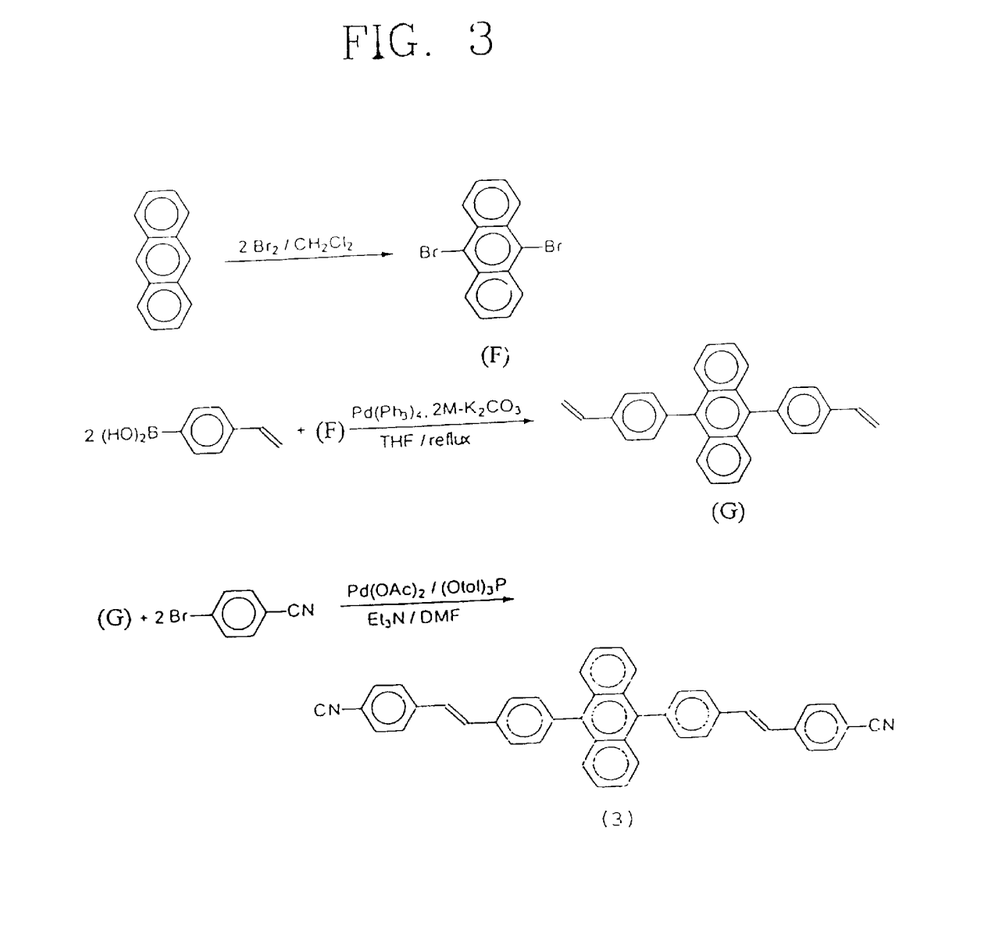

FIGS. 2 and 3 illustrate the process of synthesis of the compounds represented by the formulae (2) and (3). Hereinafter, the present invention will be described through the following examples with reference to FIGS. 2 and 3. However, the present invention is not limited to the following examples.

Synthesis Example 1
Compound of the Formula (2) (See. FIG. 2)

4-Bromobenzylbromide was dissolved in benzene, and 1 equiv. of triphenylphosphine was added to the solution. The mixture was refluxed for 12 hours, resulting in a compound (A) (yield: 95%). After adding benzophenone to the compound (A), the Wittig reaction was performed to attain a compound (B) (yield: 40%).

N,N'-dimethylformamide (DMF) was dissolved in 4-methoxyphenol, and 2-ethylbromohexane and potassium carbonate ($K_2CO_3$) were added to the solution, and then refluxed for 24 hours. The reaction mixture was poured in cold water for precipitation. The resultant precipitate was filtered and dried, resulting in a compound (c) (yield: 80%).

The compound (c) was dissolved in benzene, and bromine was added to the mixture for bromination, resulting in a compound (D) (yield: 65%).

After dissolving the compound (D) in tetrahydrofuran (THF), magnesium (Mg) was added to the mixture and refluxed for 1 hour to prepare the corresponding Grignard reagent. The Grignard reagent was reacted with trimethoxyborate, resulting in a compound (E) (yield: 47%).

THF and the compound (E) were added to 2 equiv. of the compound (B), and tetrakis(triphenylphosphine)palladium and $2MK_2CO_3$ aqueous solution were then added to the mixture, resulting in the compound represented by the formula (2) (yield: 85%).

Synthesis Example 2
Compound of the Formula (3) (See, FIG. 3)

Anthracene was dissolved in methylene chloride, and the mixture was cooled down to −50°. After adding 2 equiv. of bromine to the reaction mixture, the mixture was stirred at room temperature for 24 hours for bromination, resulting in a compound (F) (yield: 85%).

The compound (F) was dissolved in THF, and 4-vinylphenylboronic acid, tetrakis(triphenylphosphine) palladium and 2M $K_2CO_3$ aqueous solution were then added to the mixture. The reaction mixture was refluxed for 24 hours, resulting in a compound (G) (yield: 60%).

DMF, 4-bromobenzonitrile, palladium (II) diacetate (($CH_3CO_2)_2Pd$), tritolylphosphine (($CH_3C_6H_4O)_3P$) and trimethylamine were added to the compound (G), and then heated to 100° C. Then, the reaction mixture was stirred for 40 hours.

After the reaction is completed, the reaction mixture was poured into for precipitation. The resulting precipitant was dissolved in chloroform, and then methanol was added to the solution for re-precipitation. The precipitate was filtered and dried, to attain the compound represented by the formula (3) (yield: 70%).

EXAMPLE 1

After forming an electrode of ITO on a glass substrate, N,N'-bis(3-methylphenyl)-N,N'-diphenyl-[1,1'-biphenyl]4, 4'-diamine (TPD) was deposited on the electrode under vacuum, to form a hole transport layer having a thickness of 500 Å.

Then, the compound of the formula (2) was deposited on the hole transport layer under vacuum, to form a light-emitting layer having a thickness of 350 Å.

Then, Al and Li were simultaneously deposited on the light-emitting layer under vacuum, to form an Al—Li electrode having a thickness of 2,000 Å, resulting in an organic EL device.

EXAMPLE 2

After forming an electrode of ITO on a glass substrate, N,N'-bis(3-methylphenyl)-N,N'-diphenyl-[1,1'-biphenyl]4, 4'-diamine (TPD) was deposited on the electrode under vacuum, to form a hole transport layer having a thickness of 500 Å.

Then, the compound of the formula (2) was deposited on the hole transport layer under vacuum, to form a light-emitting layer having a thickness of 350 Å.

A compound represented by the following formula (6) was deposited on the light-emitting layer under vacuum to form an electron transport layer having a thickness of 350 Å. Then, Al and Li were simultaneously deposited on the electron transport layer under vacuum, to form an Al—Li electrode having a thickness of 2,000 Å, resulting in an organic EL device.

(6)

EXAMPLE 3

After forming an electrode of ITO on a glass substrate, a composition for forming a light-emitting layer was spin-coated to form a light-emitting layer having a thickness of 350 Å.

The composition for the light-emitting layer was prepared as follows.

That is, the compound of the formula (2) and TPD were mixed at a mole ratio of 3:2. Then, the mixture and poly (methylmethacrylate) as a matrix polymer were mixed in a ratio of 1:1 based on the weight. Then, the resulting mixture was dissolved in 1,2-dichloroethane at a concentration of 1 wt %.

Then, Al and Li were simultaneously deposited on the light-emitting layer under vacuum, to form an Al—Li electrode having a thickness of 2,000 Å, resulting in an organic EL device.

EXAMPLE 4

After forming an electrode of ITO on a glass substrate, a composition for forming a light-emitting layer was spin-coated to form a light-emitting layer having a thickness of 350 Å.

The composition for the light-emitting layer was prepared as follows.

That is, the compound of the formula (2) and a compound (PDPMA) represented by the following formula (7) were mixed at a mole ratio of 3:2, and the mixture was then dissolved in 1,2-dichloroethane at a concentration of 1 wt %.

Then, Al and Li were simultaneously deposited on the light-emitting layer under vacuum, to form an Al—Li electrode having a thickness of 2,000 Å, resulting in an organic EL device.

(7)

In the formula (2), z is an integer from 10 to 100.

EXAMPLE 5

After forming an electrode of ITO on a glass substrate, TPD was deposited under vacuum to form a hole transport layer having a thickness of 500 Å.

The composition represented by the formula (3) was deposited under vacuum on the hole transport layer to form a light-emitting layer having a thickness of 350 Å.

Then, the compound represented by the formula (4) was deposited under vacuum on the light-emitting layer to form an electron transport layer having a thickness of 350 Å. Then, Al and Li were simultaneously deposited on the electron transport layer under vacuum, to form an Al—Li electrode having a thickness of 2,000 Å, resulting in an organic EL device.

EXAMPLE 6

After forming an electrode of ITO on a glass substrate, TPD was deposited under vacuum to form a hole transport layer having a thickness of 500 Å.

The composition represented by the formula (4) was deposited under vacuum on the hole transport layer to form a light-emitting layer having a thickness of 500 Å.

Then, the compound represented by the formula (6) was deposited under vacuum on the light-emitting layer to form an electron transport layer having a thickness of 350 Å. Then, Al and Li were simultaneously deposited on the electron transport layer under vacuum, to form an Al—Li electrode having a thickness of 1,000 Å, resulting in an organic EL device.

EXAMPLE 7

After forming an electrode of ITO on a glass substrate, TPD was deposited under vacuum to form a hole transport layer having a thickness of 500 Å.

The composition represented by the formula (4) was deposited under vacuum on the hole transport layer to form a light-emitting layer having a thickness of 450 Å.

Then, the compound represented by the formula (6) was deposited under vacuum on the light-emitting layer to form an electron transport layer having a thickness of 250 Å. Then, Al and Li were simultaneously deposited on the electron transport layer under vacuum, to form an Al—Li electrode having a thickness of 1,000 Å, resulting in an organic EL device.

EXAMPLE 8

After forming an electrode of ITO on a glass substrate, TPD was deposited under vacuum to form a hole transport layer having a thickness of 500 Å.

The composition represented by the formula (5) was deposited under vacuum on the hole transport layer to form a light-emitting layer having a thickness of 350 Å.

Then, bathocuproine was deposited under vacuum on the light-emitting layer to form a hole blocking layer having a thickness of 75 Å.

Then, the compound represented by the formula (6) was deposited under vacuum on the hole blocking layer to form an electron transport layer having a thickness of 350 Å. Then, Al and Li were simultaneously deposited on the electron transport layer under vacuum, to form an Al—Li electrode having a thickness of 1,000 Å, resulting in an organic EL device.

EXAMPLE 9

After forming an electrode of ITO on a glass substrate, 4,4',4''-tris(N-(2-naphthyl)-N-phenyl-amino)triphenylamine (4-TDATA) and N,N'-di(naphthalene-2-yl)-N,N'-dipheylbenzidine (NPB) were successively deposited under vacuum to form a hole transport layers having a thickness of 400 and 75 Å, respectively.

The composition represented by the formula (5) was mixed with NPB to form a mixture, and the mixture was deposited under vacuum on the hole transport layers to form a light-emitting layer having a thickness of 350 Å.

Then, the compound represented by the formula (6) was deposited under vacuum on the hole blocking layer to form an electron transport layer having a thickness of 350 Å. Then, Al and Li were simultaneously deposited on the electron transport layer under vacuum, to form an Al—Li electrode having a thickness of 1,000 Å, resulting in an organic EL device.

A turn-on voltage, luminance, luminous efficiency and color of the respective organic EL devices obtained in Examples 1 through 5 were measured, and the results are shown in Table 1, and luminance-current (L-I) efficiency, a turn-on voltage, luminance, luminous efficiency and color of the respective organic EL devices obtained in Examples 6 through 9 were measured, and the results are shown in Table 2

TABLE 1

| classification | turn-on voltage (V) | luminance (cd/m²) | luminous efficiency (lm/W) | color (EL λmax) |
|---|---|---|---|---|
| Example 1 | 6 | 646 (at 15 V, 167 mA/cm²) | — | 433 nm |
| Example 2 | 4.4 | 7178 (at 11.9 V, 262 mA/cm²) | 0.98 (at 9 V, 819 cd/cm²) | 436 nm |
| Example 3 | 7 | 198 (at 17 V, 448 mA/cm²) | — | 433 nm |
| Example 4 | 7 | 217 (at 16 V, 546 mA/cm²) | — | 437 nm |
| Example 5 | 6 | 725 (at 15 V, 84 mA/cm²) | — | 435 nm |

TABLE 2

| classification | L-I efficiency (cd/A) | turn-on voltage (V) | luminance (cd/m²) | luminous efficiency (lm/W) | color (EL λmax) |
|---|---|---|---|---|---|
| Example 6 | 2.9 | 4.4 | 7178 (at 11.9 V, 262 mA/cm²) | 0.98 (at 9.25 V, 819 cd/cm²) | 436 nm |
| Example 7 | 2.5 | 5.6 | 8581 (at 14 V, 364 mA/cm²) | 0.69 (at 11.5 V, 837 cd/cm²) | 436 nm |
| Example 8 | 3.7 | 4 | 11170 (at 12.25 V, 388 mA/cm²) | 1.77 (at 6.5 V, 238 cd/cm²) | 454 nm |
| Example 9 | 3.4 | 4 | 12569 (at 11.5 V, 429 mA/cm²) | 1.28 (at 8.25 V, 1095 cd/cm²) | 458 nm |

As can be understood from Table 1, the organic EL devices obtained in Examples 1 through 5 can display the blue color. In particular, the organic EL devices obtained in Examples 6 through 9 have good L-I efficiency.

The compound represented by the formula (1) according to the present invention, as a blue luminous material, is good in luminous efficiency, and is useful as a color-developing substance for a display device.

In the organic EL device according to the present invention, an organic film such as a light-emitting layer is formed of the compound of the formula (1), so that luminous efficiency and luminance characteristics thereof are improved compared to the case of using a general blue light-emitting compound.

What is claimed is:

1. An organic electro-luminescence device comprising an organic layer between a pair of electrodes, wherein the organic layer comprises a compound represented by the chemical formula (1):

(1)

wherein $Ar_1$, $Ar_3$, and $Ar_5$ are independently selected from the group consisting of chemical bond, unsubstituted or substituted phenyl, unsubstituted or substituted naphthalene, unsubstituted or substituted anthracene, unsubstituted or substituted diphenylanthracene, unsubstituted or substituted phenanthrene, unsubstituted or substituted indene, unsubstituted or substituted acenaphthene, unsubstituted or substituted biphenyl, unsubstituted or substituted fluorene, unsubstituted or substituted carbazole, unsubstituted or substituted thiophene, unsubstituted or substituted pyridine, unsubstituted or substituted oxadiazole, unsubstituted or substituted oxazole, unsubstituted or substituted triazole, unsubstituted or substituted benzothiophene, unsubstituted or substituted dibenzofuran, and unsubstituted or substituted thiadiazole, and $R_1$, $R_2$, $R_3$, and $R_4$ are independently selected from the group consisting of hydrogen, ethyleneoxy group, $C_1$–$C_{20}$ alkyl group, aryl group, trimethylsilyl group, trimethylsily laryl group and cyano group, wherein $Ar_2$ and $Ar_4$ are represented by the following structural formula:

and wherein $R_{11}$ and $R_{12}$ are independently a $C_1$–$C_{20}$ alkyl group, phenyl group or alkylsilyl group.

2. An organic electro-luminescence device comprising an organic layer between a pair of electrodes, wherein the organic layer comprises a compound represented by the chemical formula (1):

(1)

wherein $Ar_1$, $Ar_3$, and Ar3 are all phenyl groups, $Ar_2$ and $Ar_4$ are represented by the following structural formula:

and $R_1$, $R_2$, $R_3$, and $R_4$ are all hydrogen.

3. A display device adopting the light-emitting compound represented by the chemical formula (1):

(1)

wherein $Ar_1$, $Ar_3$, and $Ar_5$ are independently selected from the group consisting of chemical bond, unsubstituted or substituted phenyl, unsubstituted or substituted naphthalene, unsubstituted or substituted anthracene, unsubstituted or substituted diphenylanthracene, unsubstituted or substituted phenanthrene, unsubstituted or substituted indene, unsubstituted or substituted acenaphthene, unsubstituted or substituted biphenyl, unsubstituted or substituted fluorene, unsubstituted or substituted carbazole, unsubstituted or substituted thiophene, unsubstituted or substituted pyridine, unsubstituted or substituted oxadiazole, unsubstituted or substituted oxazole, unsubstituted or substituted triazole, unsubstituted or substituted benzothiophene, unsubstituted or substituted dibenzofuran, and unsubstituted or substituted thiadiazole, and $R_1$, $R_2$, $R_3$ and $R_4$ are independently selected from the group consisting of hydrogen, ethyleneoxy group, $C_1$–$C_{20}$ alkyl group, aryl group, trimethylsilyl group, trimethylsilylaryl group and cyano group as a color-developing substance, wherein $Ar_2$ and $Ar_4$ are represented by the following structural formula:

wherein $R_{11}$ and $R_{12}$ are independently a $C_1$–$C_{20}$ alkyl group, phenyl group or alkylsilyl group.

4. A display device adopting the light-emitting compound represented by the chemical formula (1):

(1)

wherein $Ar_1$, $Ar_3$, and $Ar_5$ are all phenyl groups, $Ar_2$ and $Ar_4$ are represented by the following formula:

$R_1$, $R_2$, $R_3$, and $R_4$ are all hydrogen.

* * * * *